United States Patent [19]

Asick et al.

[11] Patent Number: 4,464,832
[45] Date of Patent: Aug. 14, 1984

[54] METHOD OF MAKING CARTRIDGE CONNECTOR SYSTEM

[75] Inventors: John C. Asick, Harrisburg; Leon T. Ritchie, Mechanicsburg; Dale R. Zell, Elizabethtown, all of Pa.

[73] Assignee: AMP Incorporated, Harrisburg, Pa.

[21] Appl. No.: 263,794

[22] Filed: May 14, 1981

[51] Int. Cl.³ .............................................. H05K 3/34
[52] U.S. Cl. ...................................... 29/839; 29/838; 29/899; 174/68.5; 339/17 CF
[58] Field of Search ................. 29/839, 837, 848, 849, 29/850, 874; 339/17 CF, 74 R, 176 MF; 174/68.5

[56] References Cited

U.S. PATENT DOCUMENTS

| | | | |
|---|---|---|---|
| 2,925,645 | 2/1960 | Bell et al. | 29/849 |
| 2,959,758 | 11/1960 | Geshner et al. | 174/68.5 X |
| 3,300,851 | 1/1967 | Lodder | 174/68.5 X |
| 3,431,350 | 3/1969 | Haberecht | 339/176 F X |
| 3,499,218 | 3/1970 | Dahlgren et al. | 174/68.5 X |
| 3,628,243 | 12/1971 | Phol et al. | 29/849 |
| 3,638,166 | 1/1972 | Steipe | 29/874 X |
| 3,858,957 | 1/1975 | Harwood et al. | 339/74 R X |
| 4,363,930 | 12/1982 | Hoffman | 29/848 X |

Primary Examiner—Mark Rosenbaum
Assistant Examiner—Carl J. Arbes
Attorney, Agent, or Firm—Russell J. Egan

[57] ABSTRACT

An improved electronics containing cartridge and cartridge holder are disclosed. The cartridge is utilized to encase electronic circuitry, such as a bubble memory, which can be selectively added to main equipment via the cartridge holder. The cartridge itself is made by an improved system which eliminates the environmental concerns of printed circuit board manufacture. The circuit board of the cartridge is formed by molding a substantially planar member with a plurality of circuit trace forming grooves therein. The circuitry is stamped from a metal web and inserted into the respective grooves. The contacts of the holder and cartridge are arranged for low wear operation. Both of the cartridge and the holder are provided with means which are readily exchangeable and provide a plurality of keyed configurations to assure that only the proper cartridge will be inserted into the respective holder.

9 Claims, 9 Drawing Figures

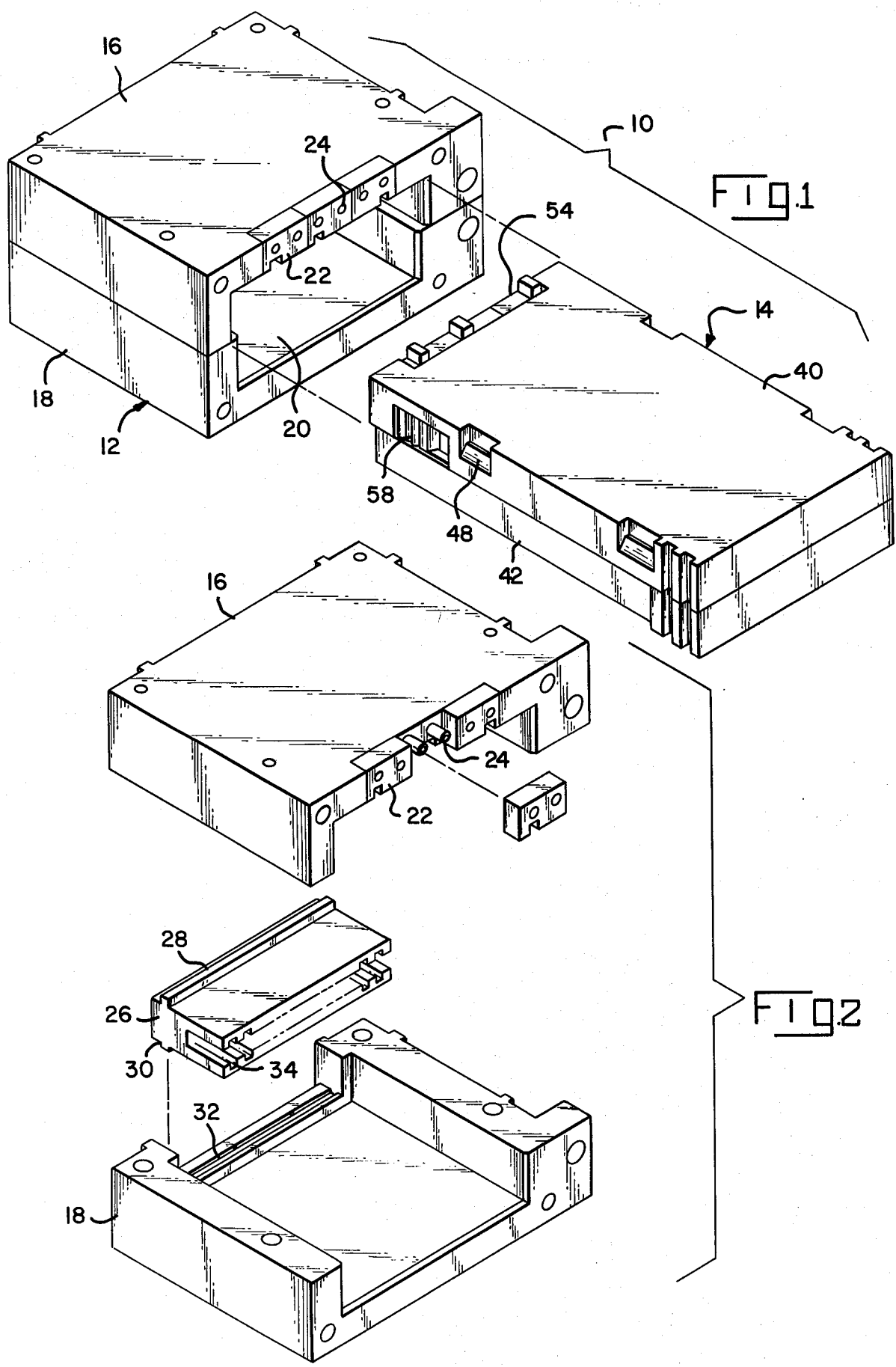

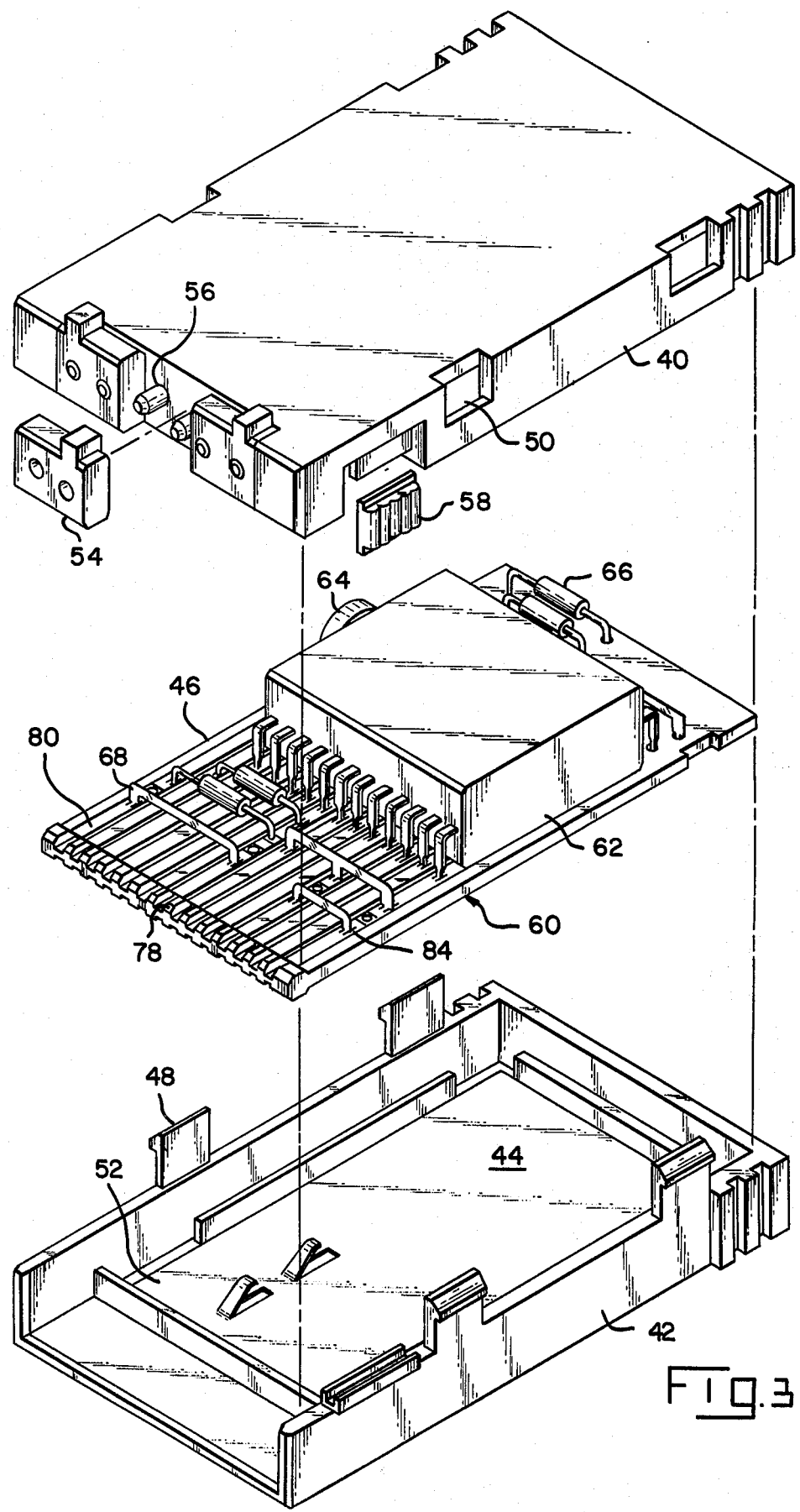

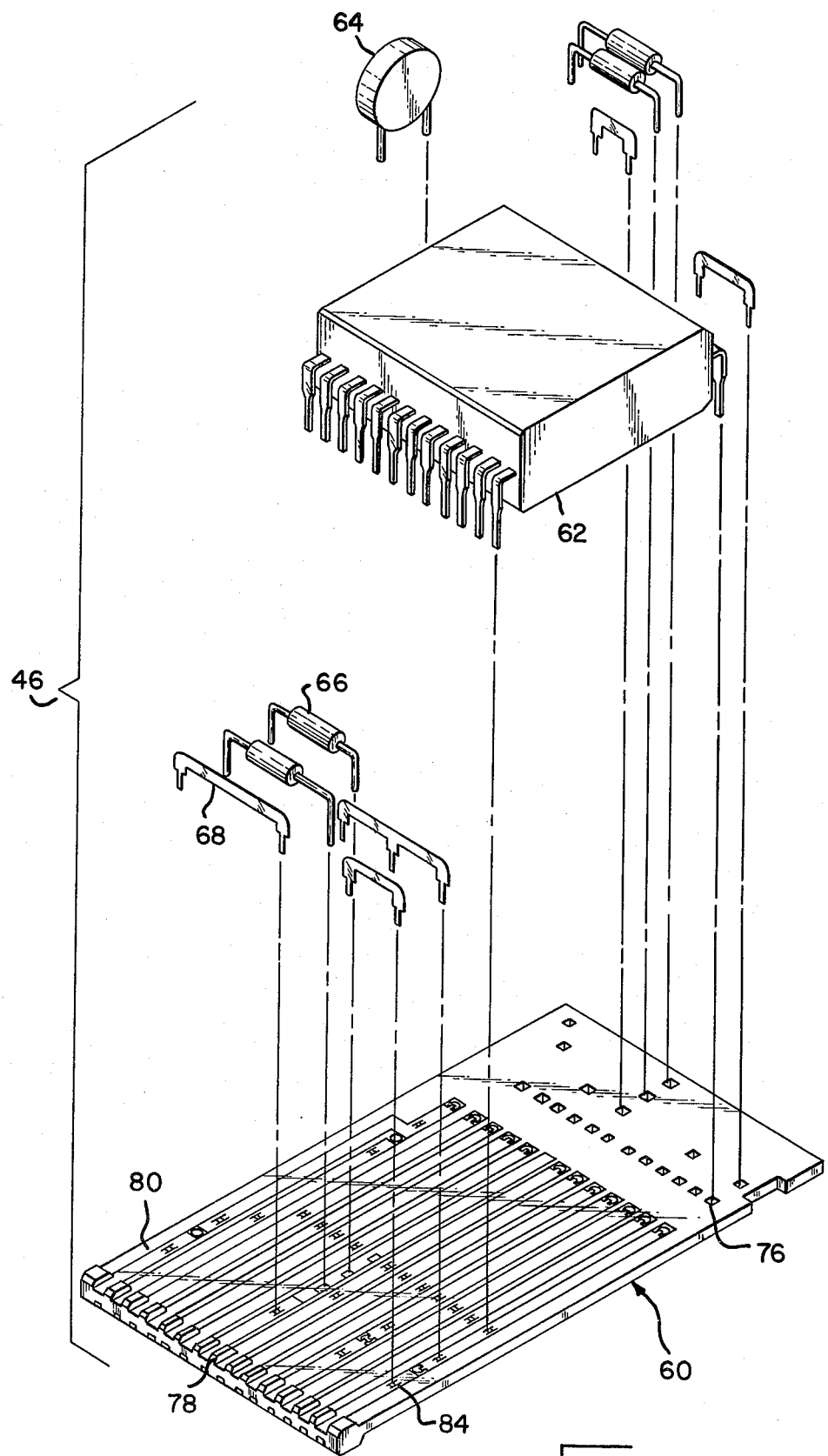

METHOD OF MAKING CARTRIDGE CONNECTOR SYSTEM

BACKGROUND OF THE INVENTION

1. The Field of the Invention

The present invention relates to an electronic component containing cartridge and a holder receiving the cartridge and in particular to an improved cartridge including a method of making a circuit board portion thereof. Both the cartridge and the housing include keying means and means to assure the proper positioning of the cartridge within the housing.

2. The Prior Art

There is a need for electronic equipment to be able to accommodate memory, and other add-on components, in the form of cartridges so that primary equipment can be readily adapted to perform a wide variety of functions. An example would be cartridges containing tapes having computer programs thereon and which cartridges could be inserted into a portion of a computer to run a specific program. Likewise, a cartridge could contain an information storage system, such as a bubble memory, and be inserted into a computer in order to supply it with specific information relating to a particular program. Heretofore, systems that were capable of handling cartridges have not had the desired versatility and/or were extremely expensive. Further, the circuit board portions of these cartridges are expensive to produce and are subject to mounting environmental concerns in production.

SUMMARY OF THE INVENTION

The present invention relates to an electronic cartridge, a cartridge holder assembly, and to the method of manufacturing a circuit board portion of the cartridge. The cartridge is formed by mating housing members enclosing an electronics package having a molded carrier member which has an array of stamped and formed contacts inlaid into at least one planar side thereof. Each contact of the array has a number of H-shaped slots stamped therein which receive legs of electronic components and/or interconnect means. The assembled contact carrier is accessible at one end of the housing members. This end of the housing members also includes adjustable and resettable keying means. The cartridge is received in the holder having members defining a cartridge receiving cavity therein. Means are included on the periphery of the holder to define keying which must be matched by the keying carried by the cartridge. The holder further includes electrical connector means which engage the circuitry of the cartridge as well as existing circuitry in main equipment carrying said holder.

It is therefore an object of the present invention to teach an improved method for forming circuitry which will obviate the environmental considerations associated with the conventional method for forming what is known as printed circuitry.

It is a further object of the present invention to produce an improved cartridge sub-assembly which can be readily assembled into a wide variety of configurations from relatively few components.

It is another object of the present invention to produce an improved cartridge connector assembly having a housing received on a main piece of electronic equipment and adopted to receive therein a cartridge containing additional circuitry.

It is a further object of the present invention to produce a cartridge mounting assembly in which both the cartridge and an associated housing have keying means which are readily adjustable for a wide variety of keying configurations to assure that only the proper cartridge is inserted into the respective housing.

It is yet another object of the present invention to produce an improved cartridge connector system in which terminals of a holder have a low ear effect on circuitry of the cartridge.

It is a still further object of the present invention to produce an improved cartridge connector assembly which can be readily and economically produced.

The means for accomplishing the foregoing objects and other advantages of the present invention will become apparent to those skilled in the art from the following detailed description taken with reference to the accompanying drawings.

BRIEF DESCRIPTION OF THE DRAWINGS

FIG. 1 is a perspective view of the subject connector assembly with a cartridge exploded from a holder housing;

FIG. 2 is an exploded perspective view of the holder housing of the subject connector assembly;

FIG. 3 is an exploded perspective view of the cartridge of the subject invention;

FIG. 4 is a perspective view of a circuit board contained within the cartridge, with components exploded therefrom;

DETAILED DESCRIPTION OF THE PREFERRED EMBODIMENT

Figure 5:
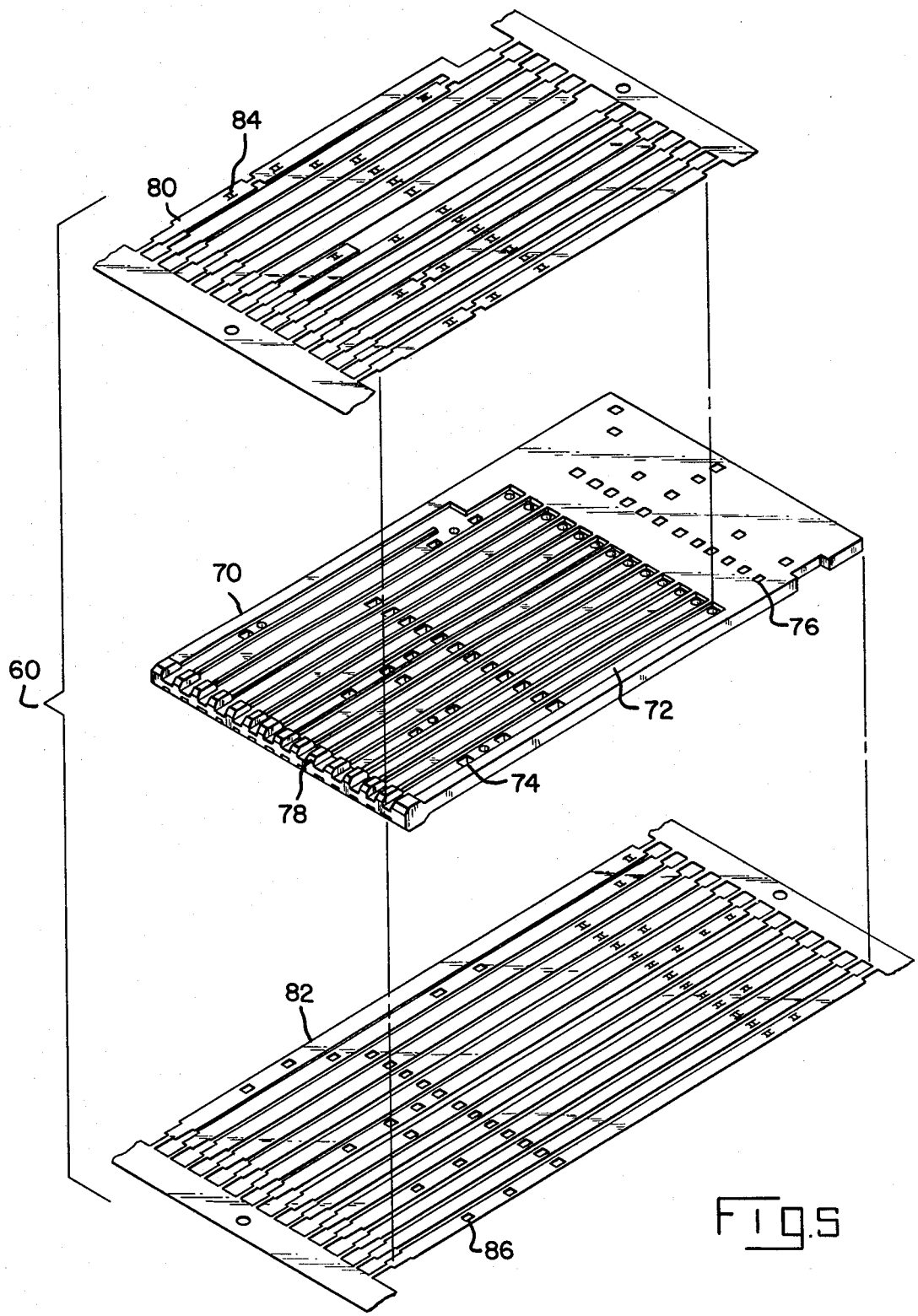
FIG. 5 is an exploded perspective view of the circuit board of FIG. 4 showing the make-up of the circuit board.

The subject cartridge connector system 10 includes a holder assembly 12 and a cartridge assembly 14. The holder assembly 12 includes first and second mating housing members 16, 18 which together define therebetween a cartridge receiving cavity 20. One of the housing members is provided with a plurality of removable keying members 22 which are held on the housing member 16 by a series of integral pins 24. Either of the housing members 16, 18 can also include mounting means (not shown) for securing it in related equipment. A cartridge receptacle connector 26 is mounted in the housing 12 by means of the elongated ridges 28, 30 which engage in like slots 32 in the housing members 16, 18. The connector 26 includes a plurality of contact passages 34 in which pairs of terminals 36, 38 (see FIG. 6) are mounted.

The cartridge 14 will be explained with reference to FIGS. 3 to 5. The cartridge 14 is formed by a pair of mating housing members 40, 42 which together define a cavity 44 which receives a circuit assembly 46 therein.

The housing members 40, 42 are provided with interengaging latching means 48, 50 for securing the housing members 40, 42 together in known fashion. The cartridge 14 can also include a ground plane 52, if desired. One end of one housing member 40 is provided with a plurality of keying blocks 54 which are removably mounted on integral pins 56. The cartridge 14 is also provided with a slide switch plate 58, the purpose of which will be discussed later.

Figure 7:
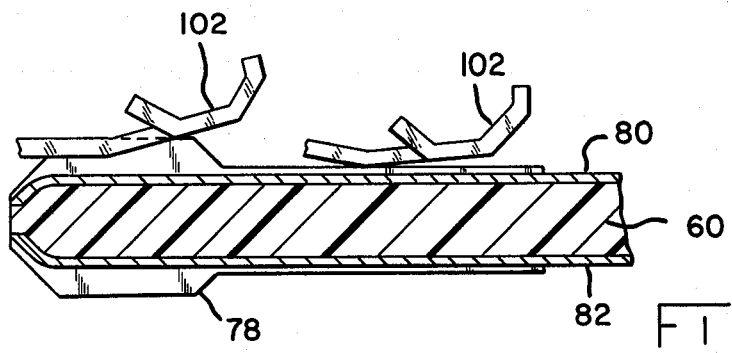
FIG. 7 is a side elevation action view showing the sequence of engagement of a holder terminal with a circuit of the circuit board.
Figure 8:
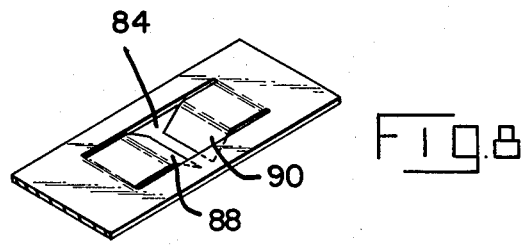
FIG. 8 is a detail perspective view of a portion of the circuitry.
Figure 9:
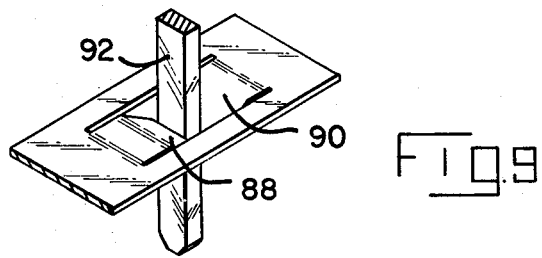
FIG. 9 is a detail perspective view of the circuitry with a portion of a component mounted therein.

The circuit assembly 46, see FIG. 4, includes a circuit board 60 having an integrated circuit 62, such as a bubble memory, mounted therein along with a plurality of conventional components such as a thermistor 64, resistors 66, and commoning bars 68. The circuit board 60 is itself made up of components shown in FIG. 5. The board 70, which is molded of rigid insulative material, has a series of parallel grooves 72 extending in parallel spaced relationship on at least one surface thereof to form a circuit array. A plurality of apertures 74, 76 are formed extending through the board 70. One end of the board 70 is molded to have a camming profile 78 (see FIG. 7). First and second circuits 80, 82 are stamped and formed from strip stock in known fashion. These circuits can be plated or inlaid with any material, such as a noble metal, if so desired and the plating or inlaying are accomplished in any known fashion. Each circuit 80, 82 is also provided with a plurality of H-shaped slots 84, 86 each aligned with a respective aperture 74, 76 in the circuit board 70. The profile of the H-shape slots 84, 86 can best be seen in FIGS. 8 and 9. It will be readily seen that the slot forms two resilient tabs 88, 90 which serve to make resilient engagement with a pin or the like 92 inserted between the tabs, in the manner described in U.S. Pat. No. 3,440,716.

Figure 6:
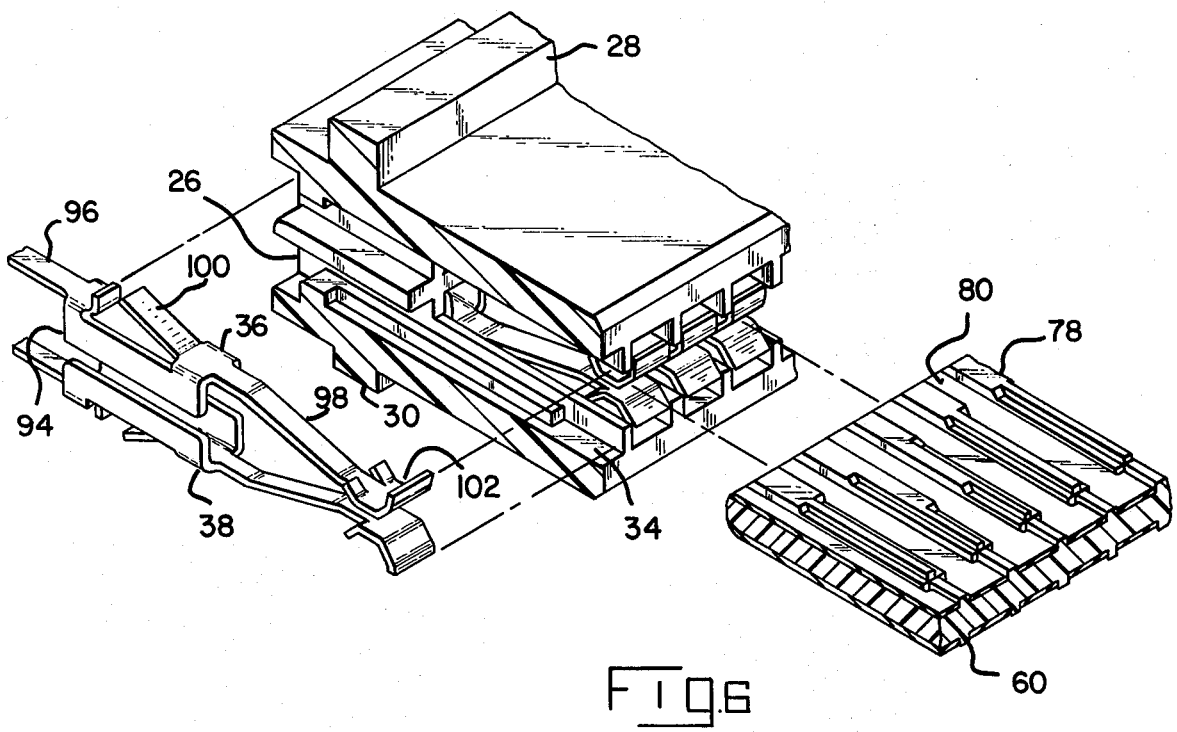
FIG. 6 is a fragmentary perspective view, partially in section, of the mating end of the circuit board and the connector portion of the holder.

Referring to FIG. 6, each of the connector terminals 36, 38 has a main body 94 with a mounting pin 96 extending in the opposite direction, and a locking lance 100 extending outwardly to engage in the passage 34 of the connector 26. The free end of the cantilever arm 98 is profiled with a transverse concavity 102 which is of greater width than the cantilever arm 98. It will be seen from FIG. 7 that the concavity 102 will ride over the cam profiles 78 of the circuit board 60 and come into engagement with the circuit 80 at a point spaced from the edge of the circuit board. This will both prevent undue wear of circuit 80 as well as prevent accidental abutting which might tend to drive the circuit 80 from the circuit board 60.

The operation of the subject invention should be readily apparent. Keying members 22, 54 of both the holder 12 and the cartridge 14 are selected to be compatible. The three blocks shown forming the keying members can provide a plurality of configurations by simple rearrangement of their order and reversing the blocks to come up with a total of at least sixteen different combinations. This would allow for the housing 12 to receive any one of sixteen compatible cartridges 14 and the associated circuitry.

The cartridge 14 is assembled by stamping the circuits 80, 82, as mentioned above, and overlaying them on a molded circuit board 70. the individual conductor portions of each circuit 80, 82 are held in place by interference fit in the respective groove 72 of the circuit board. The individual components 62, 64, 66, 68 are mounted on the circuit board by simply inserting their leads directly into the respective H-shaped slots 84, 86. The entire circuit board assembly 46 is then enclosed in the housing members 40, 42 which are snap fitted together. This snap fitting provides a sufficiently tight mounting about the circuit board that additional securing means, such as plotting material, are not necessary. One end of the circuit assembly 46 is accessible through one end of the cartridge housings 40, 42.

The switch plate 58 is used to indicate whether or not the circuit in the cartridge can be altered. For example, if the cartridge were to contain a bubble memory, the switch plate in one position would allow entry of data into the bubble memory while positioning of the switch plate in another position would prevent altering the data carried by the bubble memory.

The thus assembled cartridge 14 is simply mated with the housing 12 by inserting the cartridge into cavity 20 with the respective keying members 22, 54 in alignment. Full insertion of the cartridge drives the leading edge of the circuit board 60 into the connector 26 so that the terminals 36, 38 pass over the cams 78 and engage the respective circuits 80, 82.

The subject system could also be provided with retention means (not shown) to secure the cartridge in the holder. However, the cam profile 78 and the terminals 36, 38 would serve this function to some extent. Also, there is no force tending to cause extraction of the cartridge in normal conditions.

The present invention may be subject to many modifications and changes without departing from the spirit or essential characteristics thereof. The present embodiment should therefore be considered in all respects as illustrative and not restrictive of the scope of the invention.

What is claimed is:
1. A method for manufacturing a circuit assembly comprising the steps of:
   forming a planar member of rigid insulative material having an array of grooves on at least one major surface thereof and a plurality of apertures in said grooves extending through said member,
   forming at least one array of conductors having a like pattern as said array of grooves, each conductor having at least one H-shaped slit therein aligned to overlie a respective aperture,
   inserting said array of conductors into said array of grooves, and
   inserting leads of a plurality of components into respective H-shaped slits of said circuitry and said apertures.
2. A method according to claim 1 wherein said planar member is formed by molding.
3. A method according to claim 1 wherein said array of conductors is formed by stamping from a web of conductive material.
4. A method according to claim 3 wherein said web of conductive material is preplated to improve the electrical characteristics thereof.
5. A method according to claim 3 wherein said web of conductive material has material inlaid therein at specific locations to improve the electrical characteristics thereof.
6. A method according to claim 1 further comprising:
   adhesive means securing said conductors in said grooves.
7. A method according to claim 1 wherein said conductors are secured in respective grooves through an interference fit.
8. A method according to claim 1 further comprising the step of:
   soldering said leads to said conductors.

9. A method according to claim 1 further comprising the step of:

forming camming ramps at one end edge of said planar member adjacent and between said array of grooves whereby terminals make contact with the conductors in a direction substantially normal to their engaging surface and a scuffing mating from the end, which might tend to dislodge the conductors from the grooves, is prevented.

* * * * *